United States Patent [19]

Garwood et al.

[11] Patent Number: 5,019,784
[45] Date of Patent: May 28, 1991

[54] TIME SYMMETRIC PULSE TO UNIFORMLY ROTATE MAGNETIZATION VECTORS BY AN ARBITRARY ANGLE IN THE PRESENCE OF LARGE B1 INHOMOGENEITIES AND RESONANCE OFFSETS

[75] Inventors: Michael Garwood, Shorewood; Kamil Ugurbil, Maple Plain, both of Minn.

[73] Assignee: Regents of the University of Minnesota, Minneapolis, Minn.

[21] Appl. No.: 393,530

[22] Filed: Aug. 11, 1989

[51] Int. Cl.$^5$ .............................................. G01R 33/20
[52] U.S. Cl. ..................................... 324/307; 324/309
[58] Field of Search ............... 324/300, 307, 303, 309, 324/310, 311, 312, 313, 314, 318, 319, 322; 128/653

[56] References Cited

U.S. PATENT DOCUMENTS

| | | | |
|---|---|---|---|
| 3,723,856 | 3/1973 | Brown | 324/303 |
| 4,390,840 | 6/1983 | Ganssen et al. | 324/309 |
| 4,480,228 | 10/1984 | Bottomley | 324/309 |
| 4,486,709 | 12/1984 | Bendall | 324/314 |
| 4,528,508 | 7/1985 | Vail, III | 324/303 |
| 4,535,290 | 8/1985 | Post et al. | 324/309 |
| 4,551,680 | 11/1985 | Mackovski | 324/309 |
| 4,613,949 | 9/1986 | Glover et al. | 364/527 |
| 4,649,345 | 3/1987 | Yoda et al. | 324/309 |
| 4,695,799 | 9/1987 | Hardy et al. | 324/307 |
| 4,774,466 | 9/1988 | Sattin | 324/309 |
| 4,820,983 | 4/1989 | Bendall | 324/307 |
| 4,914,392 | 4/1990 | Ugurbil et al. | 324/309 |

FOREIGN PATENT DOCUMENTS

| | | |
|---|---|---|
| 0129356 | 12/1984 | European Pat. Off. . |
| 0166559 | 1/1986 | European Pat. Off. . |
| 0170508 | 2/1986 | European Pat. Off. . |
| 0206129 | 12/1986 | European Pat. Off. . |
| 0229228 | 7/1987 | European Pat. Off. . |
| 7403782 | 8/1975 | France . |
| 8703370 | 6/1987 | PCT Int'l Appl. . |
| 8807673 | 10/1988 | PCT Int'l Appl. . |
| 392937 | 10/1965 | Switzerland . |
| 2139764 | 11/1984 | United Kingdom . |

OTHER PUBLICATIONS

"Spatial Localization of Tissue Metabolites by Phosphorus-31 NMR Rotating Frame Zeugmatography", M. Garwood et al., Journal of Magnetic Resonance, vol. 60, pp. 268–279 (1984).

"A Modified Rotating Frame Experiment Based on a Fourier Series Window Function, Application to in Vivo Spatially Localized NMR Spectroscopy", M. Garwood et al., Journal of Magnetic Resonance, vol. 65, pp. 239–251 (1985).

"Use of Amplitude/Phase/Frequency Modulated Pulses with Highly Inhomogeneous $B_1$ Fields to Conduct Phase-Modulated Rotating Frame Experiments", K. Ugurbil et al., Society of Magnetic Resonance in Medicine, 1986 Abstract for Scientific Papers and Posters, Works in Progess #098, Aug. 18, 1986.

"Improved Fourier Series Windows for Localization in Vivo NMR Spectroscopy", M. Garwood et al., Journal of Magnetic Resonance, vol. 65, pp. 510–515 (1985).

"Amplitude and Frequency Modulated Pulses to Achieve 90° Plane Rotations with Inhomogeneous $B_1$ Fields", K. Ugurbil et al., Journal of Magnetic Resonance, vol. 72, pp. 177–185 (Mar. 1987).

"Communications: Adiabatic Refocusing Pulse Which Compensates for Variable rf Power and Off-Resonance

(List continued on next page.)

Primary Examiner—Michael J. Tokar
Attorney, Agent, or Firm—Merchant, Gould, Smith, Edell, Welter & Schmidt

[57] ABSTRACT

A method for achieving plane rotations using symmetrical adiabatic and composite pulses provides that the pulses are generated to include a pair of symmetrically positioned discontinuous phase shifts of equal but opposite magnitude and, in the case of adiabatic pulses, a flip in the effective $B^e$ executed concomitantly with the discontinuous phase shifts. Methods of spectral editing utilize the symmetrical pulse form with the discontinuous phase shifts accomplished with predetermined delays between segments of a pulse.

13 Claims, 5 Drawing Sheets

OTHER PUBLICATIONS

Effects", M. Bendall et al., *Magnetic Resonance in Medicine*, vol. 4, pp. 493-499 (May 1987).

"Amplitude and Frequency/Phase Modulated Refocusing Pulses that Induce Plane Rotations Even in the Presence of Inhomogeneous $B_1$ Fields", K. Urugbil et al., *Journal of Magnetic Resonance*, vol. 78, pp. 472-497 (Aug. 1988).

"Optimization of Modulation Functions to Improve Insensitivity of Adiabatic Pulses to Variations in $B_1$ Magnitude", K. Ugurbil et al., *Journal of Magnetic Resonance*, vol. 80, pp. 448-469 (Dec. 1988).

"Slice Selection with an Adiabatic Half-Pulse Which is Insensitive to RF Inhomogeneity", M. Garwood et al., Abstracts, Second European Congress of NMR in Medicine and Biology, Berlin, p. 40 (Jun. 23, 1988).

"$^1$H Spectroscopy Using Solvent Suppressive Adiabatic Pulses (SSAP)", M. Garwood et al., Abstract submitted for Seventh Annual Meeting of the Society of Magnetic Resonance in Medicine (Aug. 20, 1988).

"Slice Selection with Adiabatic Excitation Despite Large Variations in $B_1$ Magnitude", A. J. Johnson et al., Abstract submitted for Seventh Annual Meeting of the Society of Magnetic Resonance in Medicine (Aug. 20, 1988).

"Slice Selection with Gradient Modulated Adiabatic Excitation", A. J. Johnson et al., Abstract submitted for Seventh Annual Meeting of the Society of Magnetic Resonance in Medicine (Aug. 20, 1988).

"Magnetic Resonance Imaging with Adiabatic Pulses Using a Single Surface Coil for RF Transmission and Signal Detection", M. Garwood et al., *Magnetic Resonance in Medicine*, vol. 9, pp. 25-34 (Jan. 1989).

"Slice Selection with Gradient-Modulated Adiabatic Excitation Despite the Presence of Large $B_1$ Inhomogeneities", A. Johnson et al., *Journal of Magnetic Resonance*, vol. 81, pp. 653-660 (1989).

"Rotating Frame Zeugmatography", D. I. Hoult, *Journal of Magnetic Resonance*, vol. 33, pp. 183-197 (1979).

"Principles of Magnetic Resonance", C. P. Slichter, 2nd ed., p. 24, Springer-Verlag, Berlin/New York, 1979.

"Mappling of Metabolites in Whole Animals by $^{31}$P NMR Using Surface Coils", Joseph J. H. Ackerman et al., *Nature*, vol. 283, pp. 167-170 (Jan. 10, 1980).

"Communications: Toward Biochemical Imaging", S. J. Cox et al., *Journal of Magnetic Resonance*, vol. 40, pp. 209-212 (1980).

"A Method for Localizing High-Resolution NMR Spectra from Human Subjects", Peter Styles et al., *Magnetic Resonance in Medicine*, vol. 2, pp. 402-409 (1985).

"NMR Imaging and Spectroscopic Techniques in Biology and Medicine", Randall Bue, *HPA Bulletin*, pp. 19-27 (Dec. 1985).

"Image-Selected in Vivo Spectroscopy (ISIS), A New Technique for Spatially Selective NMR Spectroscopy", R. J. Ordidge et al., *Journal of Magnetic Resonance*, vol. 66, pp. 283-294 (1986).

"Broadband Population Inversion by Phase Modulated Pulses", J. Baum et al., *Journal of Chemical Physics*, vol. 79, p. 4643 (1983).

"Spatial Localization of High Resolution $^{31}$P Spectra with a Surface Coil", Axel Haase et al., *Journal of Magnetic Resonance*, vol. 55, pp. 164-169 (1983).

"Solvent Suppression in Fourier Transform Nuclear Magnetic Resonance", P. J. Hore, *Journal of Magnetic Resonance*, vol 55, p. 383 (1983).

"Volume-Selective Excitation, A Novel Approach to Topical NMR", W. P. Aue et al., *Journal of Magnetic Resonance*, vol. 56, pp. 350-354 (1984).

"Depth-Resolved Surface-Coil Spectroscopy (DRESS) for in Vivo $^1$H, $^{31}$P, and $^{13}$C NMR", Paul A. Bottomley et al., *Journal of Magnetic Resonance*, vol. 59, pp. 338-342 (1984).

"Selective Spin Inversion in Nuclear Magnetic Resonance and Coherent Optics Through and Exact Solution of the Blo ch- Riccati Equation", M. S. Silver et al., *Physical Review*, vol. 31, No. 4 (Apr. 1985).

"Solvent-Suppressed Spatially Resolved Spectroscopy, An Approach to High-Resolution NMR on a Whole--Body MR System", Peter R. Luyten et al., *Journal of Magnetic Resonance*, vol. 67, pp. 148-155 (1986).

"Uniform Sample Excitation with Surface Coils for in Vivo Spectroscopy by Adiabatic Rapid Half Passage", M. Robin Bendall et al., *Journal of Magnetic Resonance*, vol. 67, pp. 376-381 (1986).

"Improved Selective 180° Radiofrequency Pulses for Magnetization Inversion and Phase Reversal", Hon (List continued on next page.)

OTHER PUBLICATIONS

Yan et al., *Journal of Magnetic Resonance*, vol. 71, pp. 116-131 (1987).

"Variable Excitation Angle AFP Pulses", D. G. Norris et al., *Magnetic Resonance in Medicine*, 9, pp. 435-440 (1989).

*Nuclear Magnetic Resonance Imaging in Medicine*, L. Kaufman et al., p. 105.

"The Influence of Experimental Parameters in Surface-Coil NMR", A. Haase et al., *Journal of Magnetic Resonance*, vol. 56, pp. 401-412 (1984).

"Elimination of High-Flux Signals near Surface Coils and Field Gradient Sample Localization Using Depth Pulses", M. Bendall, *Journal of Magnetic Resonance*, vol. 59, 406-429 (1984).

"Pulse and Fourier Transform NMR", p. 13, T. C. Farrar and E. D. Becker, Academic Press, New York (1971).

"Theoretical Description of Depth Pulse Sequences, On and Off Resonance, Including Improvements and Extensions Thereof", M. Bendall et al., *Magnetic Resonance in Medicine*, vol. 2, pp. 91-113 (1985).

"Composite Pulses without Phase Distortion", R. Tycko et al., *Journal of Magnetic Resonance*, vol. 61, pp. 90-101 (1985).

"Highly Selective n/2 and n Pulse Generation", M. Silver et al., *Journal of Magnetic Resonance*, vol. 59, pp. 347-351 (1984).

"Comparison of Depth Pulse Sequences with Composite Pulses for Spatial Selection in in Vivo NMR", M. Bendall, *Journal of Magnetic Resonance*, vol. 63, pp. 494-503 (1985).

"Suppression of Artifacts in Two-Dimensional J Spectroscopy", G. Bodenhausen et al., *Journal of Magnetic Resonance*, vol. 27, pp. 511-514 (1977).

TIME SYMMETRIC PULSE TO UNIFORMLY ROTATE MAGNETIZATION VECTORS BY AN ARBITRARY ANGLE IN THE PRESENCE OF LARGE B1 INHOMOGENEITIES AND RESONANCE OFFSETS

TECHNICAL FIELD OF THE INVENTION

The present invention relates generally to magnetic resonance imaging and spectroscopy, and more particularly to methods for rotating magnetization vectors by an arbitrary angle in the presence of $B_1$ inhomogeneities.

BACKGROUND OF THE INVENTION

For most in vivo nuclear magnetic resonance (NMR) applications, enhanced sensitivity can be achieved by using a surface coil receiver (Ackerman, J. J. H., Grove, T. H., Wong, G. G., Gadian, D. G., Radda, G. K. (1980) Mapping of metabolites in whole animals by $^{31}P$ NMR using surface coils. Nature (London) 283:167-170). Because detected signal intensity is proportional to the magnitude of the surface coil magnetic field, $B_1$, which decreases with distance from the coil, the sensitive volume is confined to a hemispherical region immediately adjacent to the plane of the coil. Detectable sample noise (and signal) is restricted to the coil sensitive volume, and for magnetic resonance imaging (MRI) and spectroscopy (MRS) of localized regions, a surface coil receiver provides optimal sensitivity.

The $B_1$ inhomogeneity of surface coils limits their utility as transmitters of many pulse sequences used routinely for MRI and MRS. When surface coils are used to transmit square or conventional amplitude modulated pulses, a continuous range of flip angles, $\Theta$, is produced throughout the coil sensitive volume since $\Theta = \gamma B_1 T_p$, where $\gamma$ is the gyromagnetic ratio and $T_p$ is the pulse length. Because only transverse components of the magnetization can be detected by a receiver coil (i.e., signal is proportional to $B_1 \sin \Theta$), the signal intensity generated by a conventional pulse is spatially dependent. Consequently, no signal can arise from sample regions where $\Theta$ is a multiple of 180°, and in MRS applications, signals generated from regions where $\Theta = 90°$ may be partially canceled by signals produced where $\Theta = 270°$.

Conventional pulses can be used for single surface coil MRI, but in such applications the flip angle and T1-weighting is nonuniform over the active volume of the coil; consequently, the image quality is severely degraded.

For many applications (e.g., spin-echo MRI and spectroscopic imaging), circumscribing whole-head or whole-body coils with relatively homogeneous $B_1$ are employed to transmit pulses, while a separate surface coil is used for signal detection. The complexity of the RF probe needed to conduct combined imaging and multinuclear spectroscopic studies using surface coil receivers can make these types of investigations impractical.

A much more serious problem in such applications is sensitivity. It has been demonstrated that the spectroscopic sensitivity of the double coil RF probe configuration (i.e., homogeneous $B_1$ transmission, surface coil reception) is not increased significantly relative that obtained with single surface coil RF transmission and reception (Crowley, M. G., Evelhoch, J. L., Ackerman, J. J. H. (1985) The surface-coil NMR receiver in the presence of homogeneous $B_1$ excitation. J. Magn. Reson. 64:20-31). Unlike the homogeneous $B_1$ produced by a circumscribing coil, the direction of the $B_1$ vector produced by a surface coil is spatially dependent, and consequently, will not have a constant phase relationship with the $B_1$ vector of the homogeneous coil. This variation in phase over space will cause incoherent addition of the signal from the different parts of the sample (Crowley, M. G., et al., see above reference). This problem is less significant for multidimensional spectroscopic imaging (SI) where the total signal is subdivided into small volume elements (voxels) which individually contain reduced phase variation. However, for applications in which spectroscopic imaging is not needed, a 250% increase in signal-to-noise ratio (S/N) may be gained if the losses due to phase mismatch of nonequivalent coils can be overcome (Crowley, et al).

One approach to gain this increased S/N involves the use of RF pulses which induce uniform flip angles despite large variations in $B_1$ magnitude and can therefore be transmitted with a surface coil. Recently, amplitude and frequency/phase modulated pulses have been described (Silver, M. S., Joseph, R. I., Hoult, D. I. (1984) Highly selective $\pi/2$ and $\pi$ pulse generation. J. Magn. Reson. 59:347-351; Baum, J., Tycko, R., Pines, A. (1985) Broadband and adiabatic inversion of a two-level system by phase-modulated pulses. Phys. Rev. A 32:3435-3447; Hardy, C. J., Edelstein, W. A., Vatis, D. (1986) Efficient adiabatic fast passage for NMR population inversion in the presence of radiofrequency field inhomogeneity and frequency offset. J. Magn. Reson. 66:470.482; Bendall, M. R. and Pegg, D. T. (1986) Uniform sample excitation with surface coils for in vivo spectroscopy by adiabatic rapid half passage. J. Magn. Reson. 67:376.381; Ugurbil, K., Garwood, M. and Bendall, M. R. (1987) Amplitude and frequency modulated pulses to achieve 90° plane rotations with inhomogeneous $B_1$ fields. J. Magn. Reson. 72:177-185; Bendall, M. R., Garwood, M. Ugurbil, K. and Pegg, D. T. (1987) Adiabatic refocusing pulse which compensates for variable RF power and off resonance effects. Magn. Reson. Med. 4:493-499; Ugurbil, K., Garwood. M., Rath, A. R. and Bendall, M. R. (1988) Amplitude- and frequency/phase-modulated refocusing pulses that induce plane rotations even in the presence of inhomogeneous $B_1$ fields. J. Magn. Reson. 78:472-497; Ugurbil, K., Garwood, M. and Rath, A. R. (1988) Optimization of modulation functions to improve insensitivity of adiabatic pulses to variations in $B_1$ magnitude. J. Magn. Reson. 80:448-469) which are based upon the principles of adiabatic passage (Slichter, C. P. In: Principles of Magnetic Resonance, 2nd ed, p. 24, Springer-Verlag, Berlin/New York, 1979) and are insensitive to $B_1$ inhomogeneity. With these pulses, the need for a separate homogeneous $B_1$ transmitter coil is obviated, a 250% increase in signal-to-noise is possible, and combined MRI and MRS can be executed in a simple fashion using a single surface coil.

To date, adiabatic pulses which can induce 90° excitation (Bendall, M. R. and Pegg, D. T. (1986) Uniform sample excitation with surface coils for in vivo spectroscopy by adiabatic rapid half passage. J. Magn. Reson. 67:376-381.), non-selective (Baum, J., Tycko, R., Pines, A. (1985) Broadband and adiabatic inversion of a two-level system by phase-modulated pulses. Phys. Rev. A 32:3435-3447; Hardy, C. J., Edelstein, W. A., Vatis, D.

(1986) Efficient adiabatic fast passage for NMR population inversion in the presence of radiofrequency field inhomogeneity and frequency offset. *J. Magn. Reson.* 66:470–482) and selective (Silver, M. S., Joseph, R. I., Hoult, D. I. (1984) Highly selective $\pi/2$ and $\pi$ pulse generation. *J. Magn. Reson.* 59:347–351) inversion, and 90° (Ugurbil, K., Garwood, M. and Bendall, M. R. (1987) Amplitude and frequency modulated pulses to achieve 90° plane rotations with inhomogeneous $B_1$ fields. *J. Magn. Reson.* 72:177–185) and 180° (Bendall, M. R., Garwood, M. Ugurbil, K. and Pegg, D. T. (1987) Adiabatic refocusing pulse which compensates for variable RF power and off resonance effects. *Magn. Reson. Med.* 4:493–499, Ugurbil, K., Garwood, M., Rath, A. R. and Bendall, M. R. (1988) Amplitude- and frequency-/phase-modulated refocusing pulses that induce plane rotations enven in the presence of inhomogeneous $B_1$ fields. *J. Magn. Reson.* 78:472–497) plane rotations have been developed. With these $B_1$-insensitive adiabatic pulses, many sophisticated pulse sequences which require uniform rotation angles can now be applied with an inhomogeneous RF transmitter coil (Garwood, M., Ugurbil, K., Rath, A., Bendall, M. R., Ross, B. D., Mitchell, S. L. and Merkle, H. (1989) Magnetic Resonance Imaging with Adiabatic Pulses Using a Single Surface Coil for RF Transmission and Signal Detection. *Magn. Res. Med.* 9:25–34).

For many surface coil MRI applications, such as spine and joint imaging, in which multiple image reconstructions in different planes may be necessary to establish a diagnosis, 3-D acquisition holds many advantages. The advent of fast low flip angle pulse schemes such as FLASH (Haase, A., Frahm, J., Matthaei, D., Hanicke, W., and Merboldt, K. D. (1986) Rapid NMR imaging using low flip angle pulses. *J. Magn. Reson.* 67:258–266) and FISP (Oppelt, A., Graumann, R., Barfuss, H. Fischer, H., Hartle, W. and Schajor, W. (1986) FISP a new fast MRI sequence. *Electromedica* 54:15–18) has made 3-D acquisition practical. Single surface coil 3-D fast imaging requires a pulse waveform capable of generating an arbitrary uniform flip angle over a wide range in $B_1$ field strength. The new adiabatic plane rotation pulse of the present invention, hereinafter referred to as BIR-4 ($B_1$ independent rotation), described below, satisfies these criteria, and is thus well suited to 3-D fast imaging experiments using a single surface coil for RF transmission and signal reception. It has been demonstrated that single surface coil fast imaging can be performed using modified versions of our previously developed adiabatic plane rotation pulses, BIR-1 and BIR-2 (Norris, D. G. and Haase, A. (1989) Variable Excitation Angle AFP Pulses. *Magn. Reson. Med.* 9:435–440). Relative to these pulses, BIR-4 can induce a plane rotation more accurately with less RF power deposition and is less sensitive to variations in resonance offset produced by chemical shift and/or $B_o$ inhomogeneity.

Adiabatic Pulses

Adiabatic pulses are best visualized and understood in a frequency modulated (FM) reference frame which rotates at the instantaneous frequency of the pulse. In this frame, with coordinates designated by $x'$, $y'$, and $z'$, the effective field, $\vec{B}^e$, is the vector sum of $\vec{B}_1$ and $\Delta\omega/\gamma$, where $\gamma$ is the gyromagnetic ratio and $\Delta\omega$ is directed along the $z'$-axis and is the time-dependent difference between the frequency of the pulse and that of the spins. Adiabatic plane rotations are induced by an inversion, or "flip", of $\vec{B}^e$ during the pulse which refocuses spins in a second reference frame (the "$B^e$ frame") which rotates about the same axis as $\vec{B}^e$ (i.e. $\vec{B}^e$ is stationary in the second rotating frame). In the $B^e$ frame, spins encounter an additional time-dependent field vector equal to $d\alpha/dt$, where $\alpha(t) = \arctan[\Delta\omega(t)/\gamma B1(t)]$.

All of the adiabatic pulses are composed of segments during which the $\vec{B}^e$ rotates 90° in the FM frame. The 90° and 180° plane rotation pulses, BIR-2 (See Ugurbil, et al. ref. above) and BIREF-1 (see Bendall, et al. and Ugurbil, et al. above), are composed of 4 and 2 such segments, respectively. In the FM frame, the direction of $\vec{B}^e$ at the onset of the pulse depends upon the particular pulse employed. The type of transformation induced by an adiabatic pulse (e.g., excitation, inversion, 90° plane rotation, etc.) does not depend upon the specific shapes of the modulation functions, $B_1(t)$ and $\Delta\omega(t)$, provided that the necessary boundary conditions are satisfied at the beginning and end of each 90° segment. However, the degree of insensitivity to $B_1$ variation and the RF power needed to induce a given transformation are governed by how well the particular modulation functions satisfy the adiabatic conditions, $\gamma B^e(t) >> |d\alpha, dt|$, throughout the pulse. We previously described a procedure to derive optimal modulation functions to satisfy the adiabatic conditions for a predetermined range of $B_1$ variation and resonance offset (or chemical shift dispersion)(see Ugurbil, et al. ref. above).

Composite Pulses

A composite pulse (M. H. Levitt and R. Freeman, *J. Magn. Reson.* 3:473, 1979) is composed of a series of square pulses, each of which may have a different phase and duration. Similar to adiabatic pulses, composite pulses are designed to induce uniform rotations in the presence of $B_1$ inhomogeneity and resonance offset. At present, however, composite pulses cannot achieve the extended degree of compensation for $B_1$ variation and frequency offset that is afforded by adiabatic pulses based on numerically optimized modulation (NOM).

Well known examples of 90° composite pulses include:

$\Theta_0 \Theta_{90}$ (M. H. Levitt and R. R. Ernst, Composite Pulses Constructed by A Recursive Expansion Procedure. *J. Magn. Reson.* 55: 247, 1983);

$(\Theta/2)_{270} \Theta_0 \Theta_{90} (\Theta/2)_0$ (M. H. Levitt, Symmetrical Composite Pulse Sequences for NMR Population Inversion. I. Compensation of Radiofrequency Field Inhomogeneity. *J. Magn. Reson.* 48: 234, 1982);

and 180° composite pulses include:

$\Theta_0\ 2\Theta_{90}\ \Theta_0$ (M. H. Levitt and R. Freeman, *J. Magn. Reson.* 33:473, 1979).

$\Theta_0\ (8\Theta/3)_{90}\ \Theta_0$ (R. Freeman, S. P. Kempsll, and M. H. Levitt, Radiofrequency Pulse Sequences Which Compensate Their Own Imperfections, *J. Magn. Reson.* 39:453, 1980).

where the phases (in degrees) of the individual square pulses are denoted by the subscripted numbers. These composite pulses perform ideal transformations when $\Theta \sim 90°$, and as $\Theta$ deviates significantly from 90°, some compensation for this imperfection is provided such that the net rotation remains fairly uniform. For example, on resonance, the composite pulse, $\Theta_0 2\Theta_{90} \Theta_0$, can invert $\geq 95\%$ of the initial longitudinal magnetization, $M_o$, despite an approximate 3-fold variation in $B_1$ magnitude (i.e., in the region where $\Theta$ ranges from 45° to 135°).

With the exception of certain composite inversion pulses (such as those mentioned above), all previously developed composite pulses are composed of square pulses with durations and phases that are not situated symmetrically about the center of the composite pulse.

Spectral Editing

In in vivo $^1$H NMR spectra, all of the metabolite resonances occur within a narrow range of frequencies (spectral width $\sim$ 10 ppm) which limits the spectral resolution In addition, spectral resolution can be further complicated by overlapping resonances in $^1$H spectra. For example, both lactate and fatty acid resonances occur at approximately 1.3 ppm in $^1$H NMR spectra. The elimination of overlapping signals and spectral simplification can be achieved with pulse sequences, known as "spectral editing" pulse sequences, which are designed to excite only specific metabolites of interest. Spectral edited NMR has previously been exploited by Shulman and co-workers (Rothman, D. L., K. L. Behar, H. P. Hetherington, R. G. Shulman. Homonuclear $^1$H double-resonance difference spectroscopy of the rat brain in vivo. *Proc. Natl. Acad. Sci. U.S.A.* 81:6330–6334, 1984; Rothman, D. L., K. L. Behar, H. P. Hetherington, J. A. den Hollander, M. R. Bendall, O. A. C. Petroff, R. G. Shulman. $^1$H-observe/$^{13}$C-decouple spectroscopic measurement of lactate and glutamate in the rate brain in vivo. *Proc. Natl. Acad. Sci. U.S.A.* 82:1633–1637, 1985) to investigate in vivo rat brain metabolism. In these experiments, conventional pulses which are sensitive to variations in $B_1$ magnitude were transmitted with surface coils. Consequently, spin excitation was spatially dependent and optimal sensitivity was not obtained throughout the coil sensitive volumes. These sensitivity losses will not arise in spectral edited NMR implemented with adiabatic pulses that tolerate large variations in $B_1$ magnitude.

SUMMARY OF THE INVENTION

The present invention provides a method for achieving plane rotations of magnetic spins utilizing a symmetrical adiabatic pulse including phase shifts of equal but opposite signs symmetrically positioned in the pulse each executed concomitantly with an inversion of $\vec{\Delta\omega}$ to cause $\vec{B^e}$ to flip in the frequency modulated (FM) frame of reference.

The invention further provides a method for achieving plane rotations utilizing a composite pulse wherein said composite pulse is symmetrical and includes discontinuous phase shifts of equal but opposite sign positioned symmetrically in the pulse.

The invention further provides a method for spectral editing by selectively generating signals from selected matter engaged in heteronuclear or homonuclear spin-spin coupling utilizing a symmetrical pulse clear or homonuclear spin-spin coupling utilizing a symmetrical pulse wherein symmetrically positioned discontinuous phase shifts are achieved utilizing delays between segments of the pulses.

DETAILED DESCRIPTION OF THE INVENTION

Adiabatic Pulses

Figure 1:
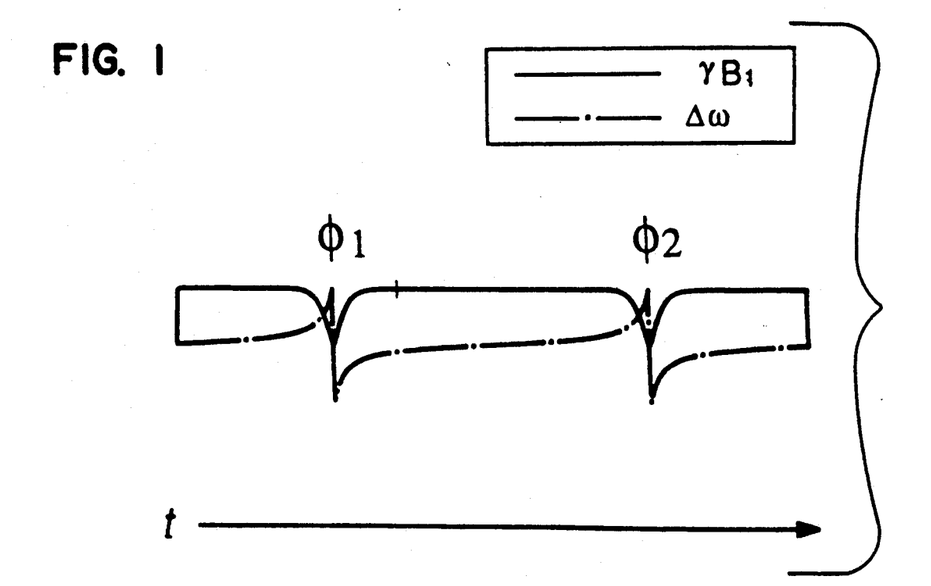
FIG. 1 illustrates the BIR-4 ($B_1$ independent rotation) pulse waveform of the present invention.

We have developed an improved plane rotation pulse (hereafter referred to as BIR-4, $B_1$ Independent Rotation-4) which incorporates two $B^e$ inversions along the z'-axis (i.e., the sign of the frequency sweep, $\Delta\omega(t)$, is reversed twice during the pulse). The rotation angle induced by this pulse is equal to the difference between the signs of two discontinuous phase shifts, $\phi_1$ and $\phi_2$, each of which takes place concomitantly with a $B^e$ inversion. The magnitude of these phase shifts can be any arbitrary value; hence, this pulse can induce a plane rotation of any arbitrary angle. Optimal efficiency is achieved with BIR-4 when $\phi_1 = 180° + \Theta/2$ and $\phi_2 = -180° - \Theta/2$, where $\Theta$ is the desired flip angle. BIR-4 with $\phi_1 = 225°$ and $\phi_2 = -225°$ executes a 90° excitation with similar efficiency to that achieved with an adiabatic half-passage transmitted with the same modulation functions and same total amount of RF power, but with significantly improved off-resonance performance. The enhanced performance of BIR-4 is attributed to the properties of symmetry exhibited by the pulse waveform when $\phi_1 = -\phi_2$. Both the amplitudes and phases of the BIR-4 waveform are symmetric about the center of the pulse. That is, the pulse amplitude and phase are equivalent at times equal to $T_p/2 + t$ and $T_p/2 - t$, where t ranges from 0 to $T_p/2$; and $T_p$ is the pulse length. FIG. 1 shows an example of BIR-4 using hyperbolic tangent and tangent modulation functions for $\gamma B_1(t)$ and $\Delta\omega(t)$, respectively. Both $\gamma B_1(t)$ and $\Delta\omega(t)$ are expressed in units of radians/sec.

As shown in FIG. 1, BIR-4 is characterized by a first segment where rotates $\vec{B^e}$ rotates 90° followed by a first discontinuous phase shift of $\phi_1$ in $B_1$ executed concomitantly with an inversion of $\vec{\Delta\omega}$ to cause $\vec{B^e}$ to flip. Next, there is a second segment which causes $\vec{B^e}$ to rotate 180° followed by a second discontinuous phase shift of $\phi_2$ in $\vec{B_1}$, with $\phi_2$ of equal but opposite sign to $\phi_1$, executed concomitantly with an inversion of $\Delta\omega$ to cause $B^e$ to flip again. The pulse ends with a third segment which causes $B^e$ to rotate another 90°. The pulse is also characterized by symmetry in amplitude and phase about its center. The first and third segments of the pulse can be executed as an adiabatic half passage executed with reverse time dependence and an adiabatic half-passage, respectively, while the second segment can be executed as consecutive adiabatic half-passage and adiabatic half-passage executed with reverse time dependence. In this particular pulse, the center is located at the junction of the two consecutive half-passages in the second segment.

While it is contemplated that BIR-4 be perfectly symmetrical about its center, it is contemplated that other segments could be introduced into the pulse which although not upsetting the symmetry of the operative elements of the pulse could render it, strictly speaking, asymmetrical. Accordingly, it shall be understood that as used herein the phrase "symmetrical about its center" shall mean symmetry with respect to the elements of the pulse essential to achieving the desired plane rotation.

The performance of BIR-4 was calculated at flip angles of 45° and 90°, and compared to a conventional sin t/t (sinc) amplitude modulated pulse at the corresponding nominal flip angles. Calculations of the magnetization vector trajectories were based on the Bloch equations. For these calculations, the initial magnetization, $M_o$, was aligned with the z axis of the rotating frame (the thermal equilibrium condition). The transverse magnetization, $M_{xy}$, was calculated as a function of the dimensionless quantity, v, where $v = \gamma B_1^o/\Delta\omega^o$. $B_1^o$ is the peak RF amplitude and $\Delta\omega^o$ is the amplitude of the modulated pulse frequency relative to the Larmor precessional frequency of the spins. When experiments are conducted with surface coils, $B_1^o$ (and $B_1(t)$) is a function of spatial position with respect to the coil. The dimensionless quantity R (see Ugurbil, et al.; Bendall, et al.; Ugurbil, K., Garwood, M., Rath, A. R. and Bendall, M. R.; Garwood, et al.), defined as $\Delta\omega^o T_p/2\pi$, was equal to 10 for these particular calculations of BIR-4, where $T_p$ is the pulse duration.

Figure 2A:
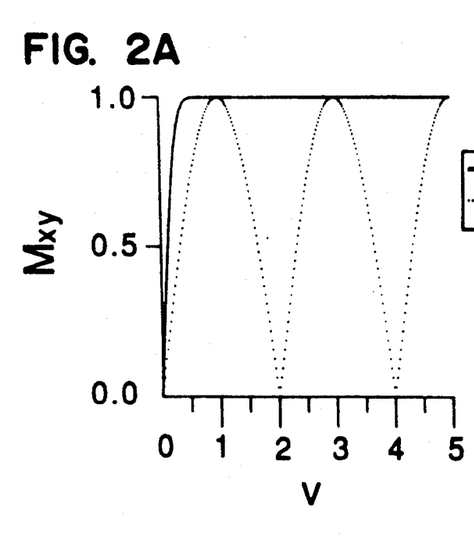
FIGS. 2a and 2b illustrate the performance of BIR-4 (solid line) and a sinc pulse (dotted line) as a function of v for both (a) 90°, and (b) 45° flip angles.
Figure 2B:
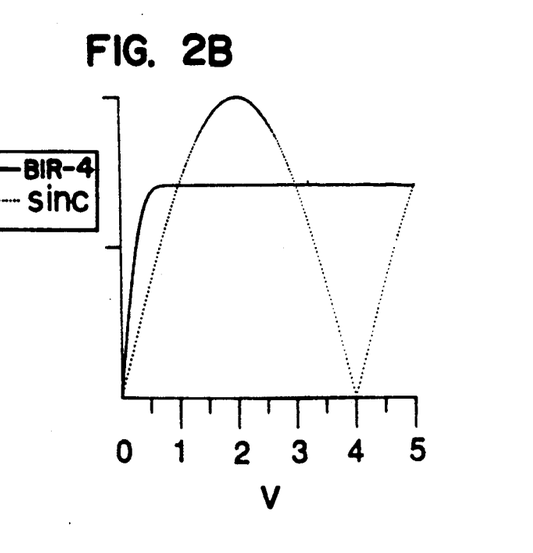

FIG. 2 shows the computer calculated pulse performance (i.e., the generated transverse magnetization, $M_{xy}$) of both a sinc pulse and BIR-4 as a function of v. It is apparent from this figure that BIR-4 generates the transverse magnetization appropriate for the specified flip angle over a wide range in v. The functional range in v shown here slightly exceeds the range in $B_1$ field intensity variation associated with a typical surface coil. The quantity v is related to RF power, and at very low values of v, BIR-4 is seen to generate less than the desired transverse magnetization, since the adiabatic condition (using the modulation functions shown in FIG. 1) has not been satisfied at these low v values. The transverse magnetization generated by the sinc pulse, in contrast to that induced by BIR-4, is directly dependent on v, and thus on $B_1$ field strength. This figure clearly demonstrates that conventional pulses cannot induce uniform excitations with RF coils that generate inhomogeneous $B_1$ fields.

Figure 3A:
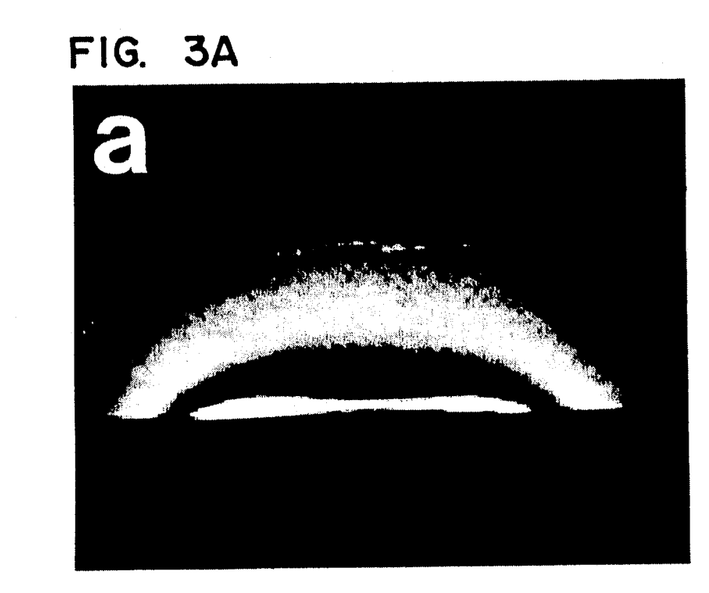
FIGS. 3a and 3b illustrate 3-D FLASH images of a water filled phantom showing excitation profiles of (a) a square pulse, and (b) BIR-4, wherein both images were generated using a single surface coil for RF transmission and signal detection.
Figure 3B:
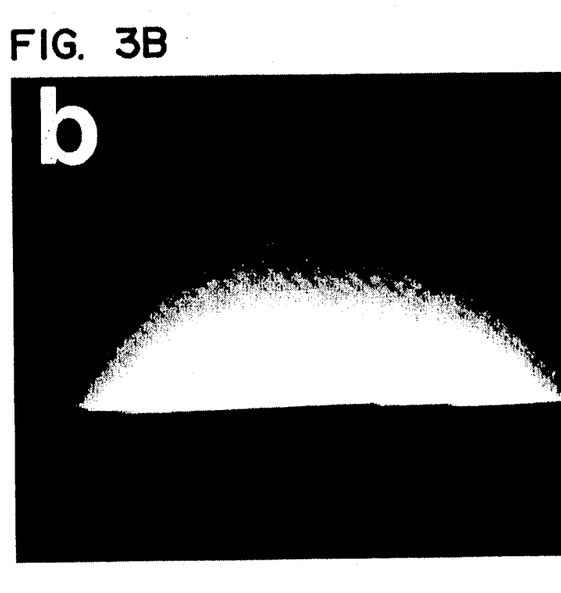
Figure 4A:
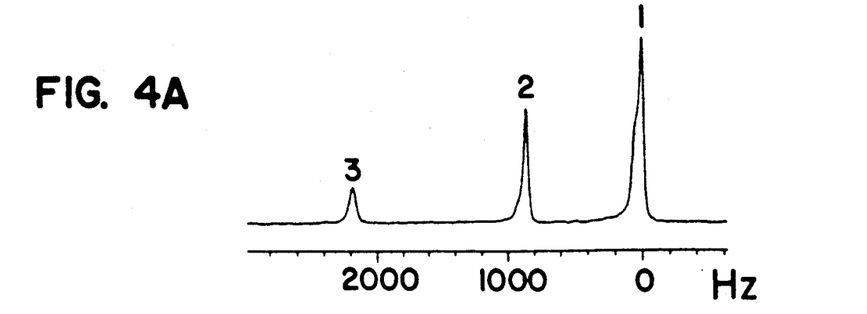
FIGS. 4a, 4b, 4c and 4d show surface coil $^{31}$P spectra of a three-chambered phantom. The signals were excited with square pulses (A, B, and C) or variable angle BIR-4 pulses (D). In A, B, and C, the duration of the square pulse was adjusted to yield maximum signal intensity for resonances 1, 2, and 3, respectively. The BIR-4 pulse lengths were all 4 ms, and the values of $\Theta$ were varied as indicated in D, using $\phi_1 = -\phi_2 = 180° + \Theta/2$.
Figure 4B:
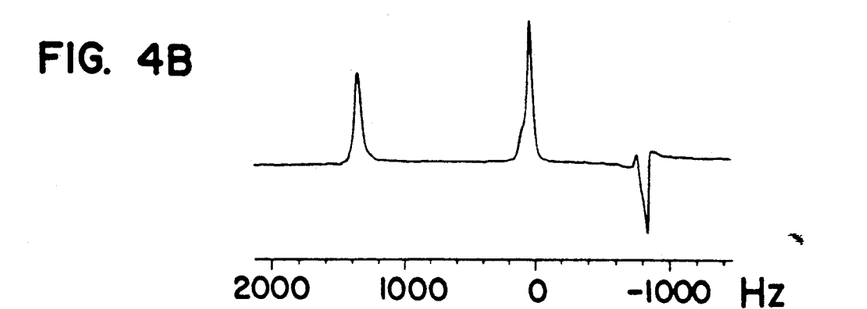
Figure 4C:
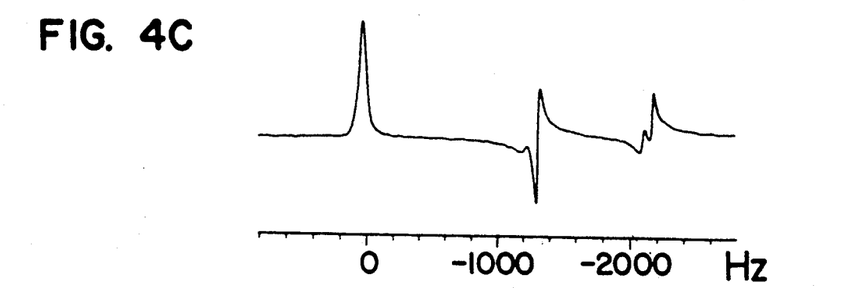
Figure 4D:
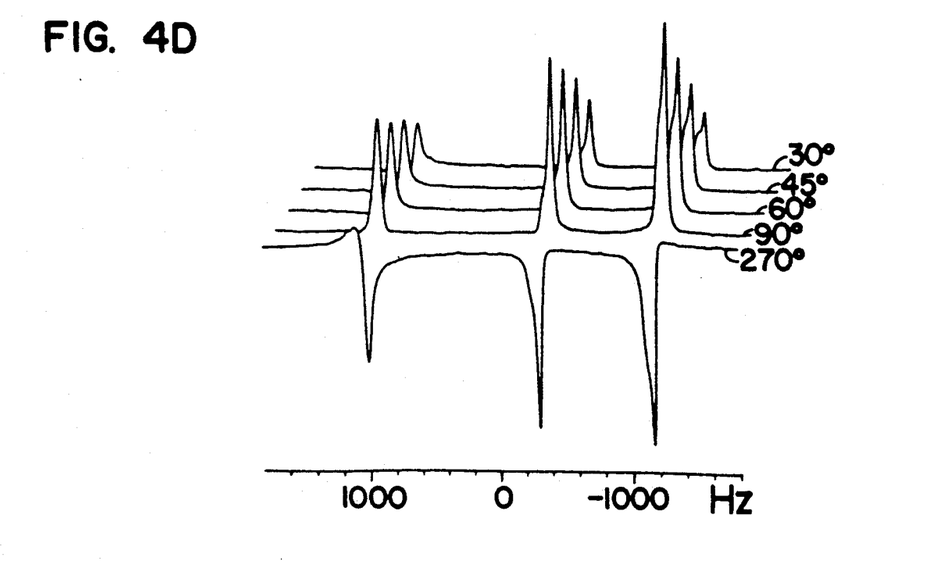

The relative performance of conventional and adiabatic pulses was also verified experimentally by a single surface coil 3-D FLASH phantom imaging experiment in which excitation with a square pulse and BIR-4 were compared. 3-D FLASH images of a water filled 8 cm diameter cylindrical phantom were generated with an 80 μs square pulse (FIG. 3a) and with a 4 ms BIR-4 (at a flip angle of 16°) (FIG. 3b), while all other parameters remained constant. TR was 200 ms, and the matrix size was 128×256×16 (128 dimension zero filled to 256 for display) with a FOV of 80×80×80 mm. As shown in FIG. 3a, a nonuniform excitation profile is characteristic of a conventional pulse transmitted with a surface coil. FIG. 3a shows flip angles varying from $\sim 270°$ (near the coil), to near zero (far from the coil). Signal is absent in an area through the center of the sensitive volume of the coil, where the sample experienced a flip angle of $\sim 180°$. The image obtained with BIR-4 (FIG. 3b), however, displays a uniform flip angle throughout the coil sensitive volume (in this case, 16°).

The contrast characteristics of a FLASH image are highly dependent on the flip angle, and uniform T1 weighting in FLASH imaging can only be achieved when a constant flip angle is induced within the entire region of interest Since BIR-4 is insensitive to large variations in $B_1$ field strength, it can induce uniform flip angles even when transmitted with a surface coil (which typically has a 10 fold or greater variation in $B_1$ field strength). Additionally, accurate calibration of RF power and flip angle is unnecessary when using BIR-4, since the flip angle is determined by phase shifts occurring within the pulse waveform ($\phi_1$ and $\phi_2$ in FIG. 1).

The tolerance of BIR-4 to chemical shift dispersion (resonance off-set) and $B_1$ inhomogeneity was also demonstrated with a $^{31}P$ spectroscopy experiment. The first, second, and third compartments of a three-chambered cylindrical phantom were filled with 0.5 M pyrophosphate, 1.0M inorganic phosphate, and 2M phenylphosphonate, respectively. The dimensions of the phantom were as follows: radius=3 cm, depth of each chamber=0.7 cm, thickness of spacers between chambers=0.5 cm. The phantom was placed adjacent to a 2.1 cm diameter surface coil tuned to the $^{31}P$ frequency (81 Hz). $^{31}P$ spectra of the phantom were obtained using conventional square pulses (FIGS. 6A-C) or BIR-4 pulses (FIG. 6D). For each spectrum generated with square pulse excitation, the pulse frequency was placed on resonance (as indicated by 0 Hz on the chemical shift axes) and the pulse duration was adjusted to yield the maximum signal intensity from that particular chamber. The pulse lengths used to acquire the spectra shown in FIGS. 6A-C were 24, 65, and 140 μs, respectively. These spectra demonstrate that square pulses cannot achieve uniform excitation across all three chambers simultaneously. FIG. 6D shows spectra obtained with BIR-4 using $\Theta = 270°$, 90°, 60°, 45°, and 30° for the consecutive spectra. For the BIR-4 experiments, the pulse frequency was positioned at the center of the spectra. The 90° BIR-4 spectrum was phase corrected using a standard software routine (i.e., only zero- and first-order phase corrections were applied). and the same phase parameters were applied to spectra acquired with other values of $\Theta$. In the 90° BIR-4 spectrum the integrated areas of resonances 1, 2, and 3 correspond to 117, 127, and 98% of the maximum intensities obtained with square pulses optimized for the individual phantom chambers. As $\Theta$ was varied with BIR-4, the relative signal intensities changed according to sin $\Theta$, as theoretically expected when the flip angle is uniform. These results illustrate the capability of BIR-4 pulses to induce variable angle Θ rotations, where Θ is uniform despite the presence of $B_1$ inhomogeneity and chemical shift dispersion.

Symmetrical Composite Pulses of Arbitrary Flip Angle with Improved Off-resonance Performance Symmetry principles, which have been shown by us to improve the performance of adiabatic plane rotation pulses and which have been used to develop BIR-4, can also be used to extend the insensitivity of composite pulses to $B_1$ intensity variation and resonance offset effects. For example, a new symmetrical composite pulse $$(\Theta/2)_{90} \; \Theta_0 \; \Theta_{225} \; (\Theta/2)_{315} \; (\Theta/2)_{315} \; \Theta_{225} \; \Theta_0 \; (\Theta/2)_{90} \quad [A]$$

induces a 90° excitation over an approximate 6-fold range in $B_1$ intensity variation and has a more extended and symmetrical off-resonance performance relative to the non-symmetrical Levitt composite pulse, $(\Theta/2)_{270} \; \Theta_0 \; \Theta_{90} \; (\Theta/2)_0$.

With these symmetrical composite pulses, the rotation angle is varied by changing the values of particular square pulse phases. A composite pulse capable of inducing any desired rotation angle can be formed using the following prescription:

$$\Theta_0 \; \Theta^{-1}{}_{(\beta/2)} \Theta_{(180°+\beta/2)} \; \Theta^{-1}{}_{180°} \quad [B]$$

where in this case, $\beta$ is the desired flip angle. $\Theta_0$ is a pulse which produces an approximate 90° rotation, and it can be either a simple square pulse, a composite pulse, or an adiabatic pulse. When reverse adiabatic half-passage pulses (i.e. adiabatic half-passage executed with reverse time dependence) are substituted for Θ and adiabatic half-passages are substituted for $\Theta^{-1}$ in [B], this composite pulse becomes BIR-4. Composite pulse [A] modified to induce arbitrary rotation angles is written as:

$$(\Theta/2)_{90} \; \Theta_0 \; \Theta_{(180+\beta/2)} \; (\Theta/2)_{(270+\beta/2)}$$
$$(\Theta/2)_{(270+\beta/2)} \; \Theta_{(180+\beta/2)} \; \Theta_0 \; (\Theta/2)_{90}$$

Adiabatic Pulses for Spectral Editing

We have developed adiabatic pulses to selectively generate signals from only those $^1H$ metabolites engaged in spin-spin coupling. Many biologically important compounds which can be detected with $^1H$ MRS are examples of $AX_n$ spin systems. The proposed methods will exploit spin-spin coupling in $AX_n$ spin systems to achieve spectral editing. In contrast to all other presently available spectral editing methods, the techniques to be developed will be insensitive to variations in $B_1$ magnitude.

Spectral editing can be accomplished with modified BIR-4 pulses. As described above, BIR-4 can induce an arbitrary rotation angle which is equal to the difference between the two phase shifts, $\phi_1$ and $\phi_2$. A 90° plane rotation can be induced with $\phi_1 = 225°$ and $\phi_2 = 225°$, whereas a 180° plane rotation is achieved with $\phi_1 = 270°$ and $\phi_2 = -270°$. However, if $\phi_1 = \phi_2$ then an identity transformation is performed. These principles are exploited in the design of adiabatic pulses for spectral editing.

If $\phi_1$ and $\phi_2$ in BIR-4 are replaced by r delay periods of equal duration, all spins receive an identity transformation since the direction of spin precession in the x'y' plane is the same during both delays (i.e., the effective phase shifts are equal). However, if the direction of spin precession is reversed during the second delay, a plane rotation is executed.

Spin-spin coupling can be exploited to switch the direction of precession between coupled spins. For instance, in an AX spin system, the spin labels on the X doublet can be switched by selectively inverting the A spins sometime between the first and second r delay. In this case, the effective phase shifts, $\phi_1$ and $\phi_2$, experienced by the X doublet protons during the first and second $\tau$ delays will be $2\pi(\nu\pm(J/2))\tau$ and $2\pi(\nu\pm(J/2))\tau$, respectively, where $\nu$ is the presessional frequency (in the rotating frame) and J is the $H_a-H_x$ spin-spin coupling constant in hertz. The same principle of spin relabelling also applies to $AX_2$ and $AX_3$ spin systems. The precession of noncoupled spins, on the other hand, will be unaltered between delays; consequently, noncoupled spins will undergo an identity transformation. Because the editing techniques are based upon spin-spin coupling, the degree of suppression of noncoupled spins is independent of $B_o$ homogeneity. In contrast to spectral editing techniques which are based upon subtraction of J-modulated signals (Rothman, D. L., K. L. Behar, H. P. Hetherington, R. G. Shulman. Homonuclear $^1H$ double-resonance difference spectroscopy of the rat brain in vivo. *Proc. Natl. Acad. Sci. U.S.A.* 81:6330–6334, 1984; Rothman, D. L., K. L. Behar, H. P. Hetherington, J. A. den Hollander, M. R. Bendall, O. A. C. Petroff, R. G. Shulman. $^1H$-observe/$^{13}C$-decouple spectroscopic measurement of lactate and glutamate in the rat brain in vivo. *Proc. Natl. Acad. Sci. U.S.A.* 82:1633–1637, 1985), the proposed methods achieve complete spectral editing in a single acquisition, and as a result, will not be susceptible to subtraction errors.

Two different modifications of BIR-4, referred to as BISEP-1 and BISEP-2 ($B_1$ independent spectral editing pulse 1 and 2), can be used for hetero- and homonuclear spectral editing, respectively. Each version of BISEP is simply BIR-4 with both discontinuous phase shifts set equal to 80° with added delay periods which allow the selected spins to precess through an angle needed to achieve a nonzero plane rotation. Also, a second adiabatic inversion pulse, is required to flip the spin labels.

a) Heteronuclear BISEP-1

Figure 5:
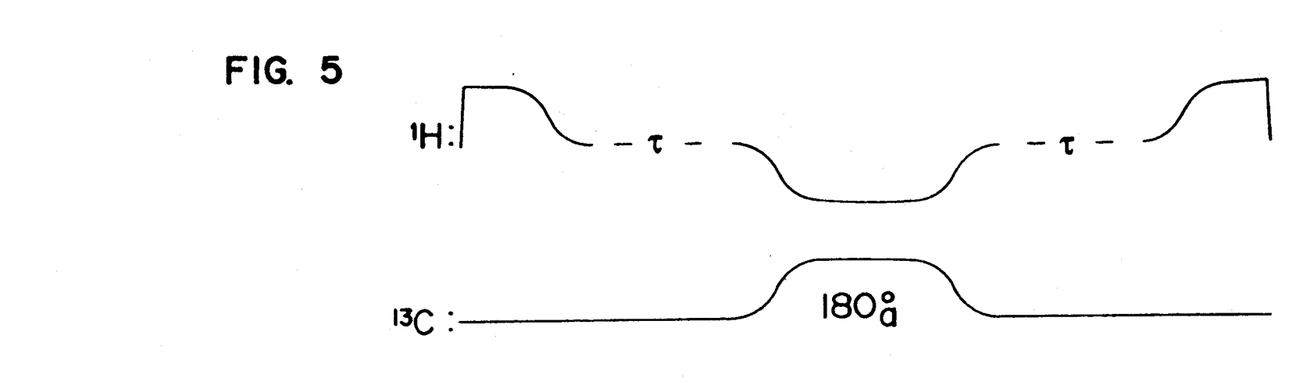
FIG. 5 is a schematic representation of the BISEP-1 pulse according to the present invention.

A schematic representation of BISEP-1 is shown in FIG. 5. BISEP-1 induces a 90° plane rotation when $\tau = 1/(8J)$, where J is the $^{13}C-{^1H}$ scalar coupling constant. For heteronuclear ($^{13}C/^1H$) spectral editing with BISEP-1, the 180°$_a$ pulse is applied at the $^{13}C$ frequency using a second RF channel and a separate $^{13}C$ coil. When 180°$_a$ is frequency selective, the 1H spectrum can be further simplified since the direction of precession is reversed only for those protons coupled to selected $^{13}C$ nuclei, while all other $^1H$ spins experience an identity transformation.

Figure 6:
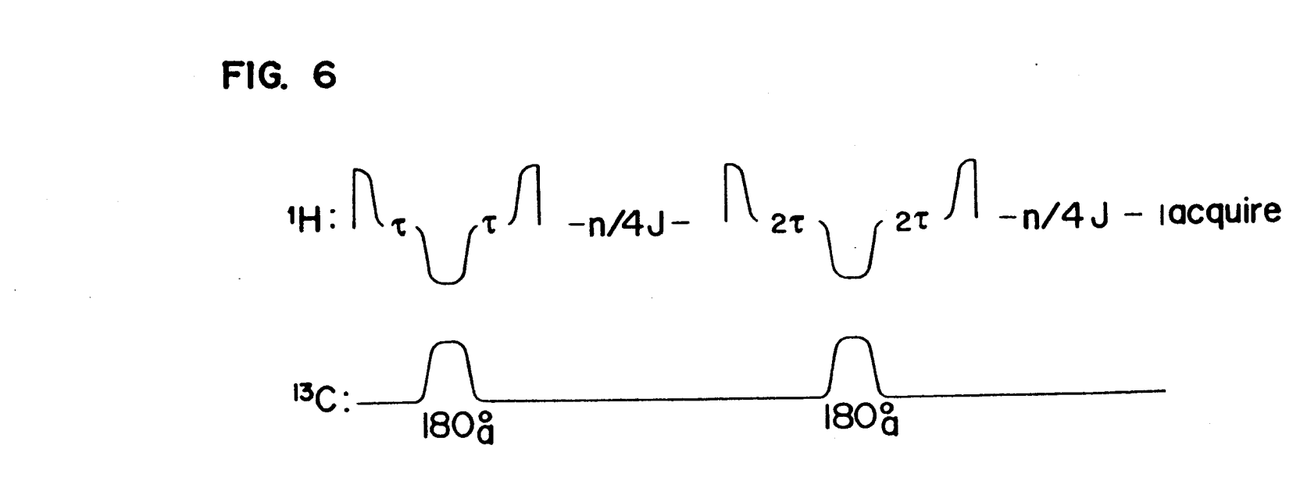
FIG. 6 shows a complete heteronuclear BISEP-1 spin-echo sequence according to the present invention.

Following excitation with a 90° BISEP-1, the $^1H$ resonances in each doublet will be separated by the $^{13}C-{^1H}$ coupling constant, but with a 180° difference in phase. Therefore, an additional pulse, 180° BISEP-1, can be used to refocus the spins along a single axis. To achieve refocusing, the 180° BISEP-1 must be surrounded by delays equal to n/(4J). where n is an odd integer. The 180° BISEP-1 is equivalent to the 90° BISEP-1 except each $\tau$ delay equals 1/(4J). The complete heteronuclear spin-echo sequence is shown in FIG. 6. With this sequence, spectral edited spectroscopic imaging experiments can be accomplished by implementing the phase encode gradients during either of the n/(4J) delay periods.

b) Homonuclear BISEP-2

Figure 7:
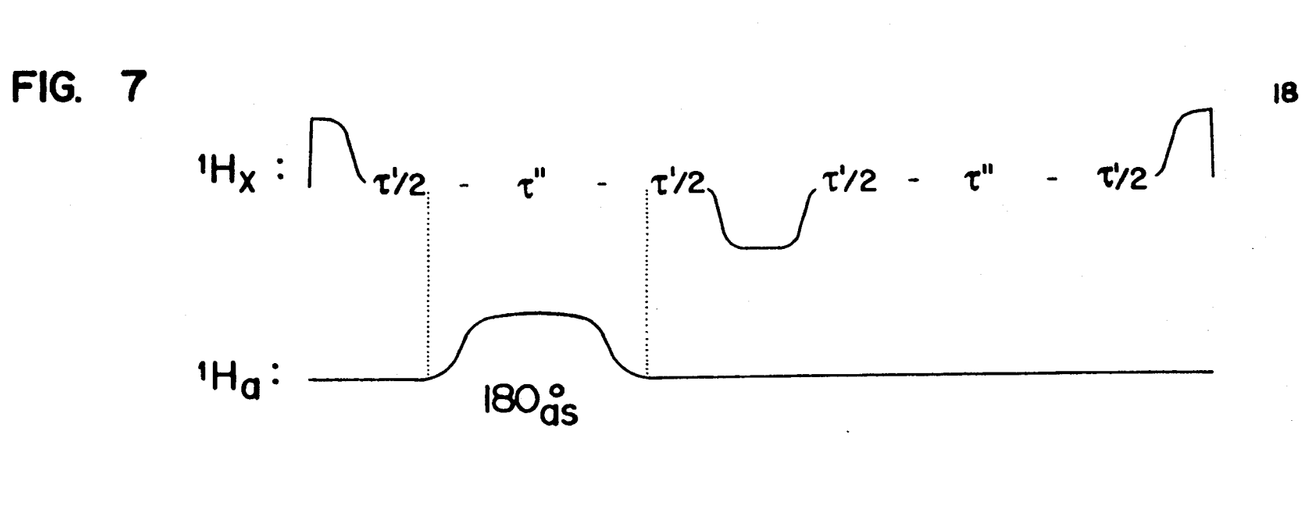
FIG. 7 is a depiction of the BISEP-2 pulse according to the present invention.

The scalar coupling, $H_a-H_x$, which occurs between the CH and CH$_3$ protons of lactate is an example of an AX$_3$ spin system. BISEP-2 exploits selective homonuclear polarization transfer in AX$_n$ spin systems to achieve spectral editing. BISEP-2 is depicted in FIG. 7. In the drawing, $\tau''$ is the duration of the selective adiabatic pulse, 180°$_{as}$, which inverts the H$_a$ spins and reverses the direction of precession of the H$_x$ spins. To induce a 90° rotation with BISEP-2, the time periods, $\tau'$ and $\tau''$, are adjusted so that $\tau'+\tau''=1/(2J)$, where J is the $H_a-H_x$ coupling constant. With this pulse, all spins not coupled directly to the H$_a$ protons experience an identity transformation.

The 90° BISEP-2 will fully excite the H$_x$ doublet resonances, but the phase difference between the individual components of the doublet resonance will be 180°. As before, an additional 180° BISEP-2 can be used to refocus the H$_x$ doublet. Homonuclear spectral edited spectroscopic imaging can be accomplished by implementing phase encode gradients during either TE/2 period in the spin.echo sequence.

BISEP-2 can also be used for heteronuclear spectral editing by using the 180°$_{as}$ pulse to selectively invert $^{13}$C nuclei instead of protons.

Finally, if in the homonuclear BISEP-2 sequence, the 180°$_{as}$ pulse is omitted, the sequence becomes a general J filtered sequence; all resonances when $(\tau'+\tau'')=\frac{1}{4}J$ will be left fully on the transverse plane, whereas non-coupled spins will undergo an identity transformation. We can refer to this pulse as BIR-4(JF) with JF standing for J filter. For simplicity let $\tau'+\tau''$ equal $\tau$. If, as an example we consider a doublet, at the end of BIR-4(JF), the two components of the doublet will 180° out of phase and the intensities of each will be modulated according to sin $2\pi J\tau$. Thus, when J=0, no magnetization is left on the transverse plane. When $2\pi J\tau=\pi/2$, maximum signal will be left on the transverse plane. A broadband 180° adiabatic refocusing pulse executed with an echo time of $2\tau$ will bring the two components of the doublet in phase when $J\tau=\frac{1}{4}$ as before.

BIR-4(JF) can be combined with phase encode gradients to generate a J filtered spectroscopic image, or can be executed with incremental values combined with 2DFT to generate two-dimensional J-coupled spectra.

In MR imaging and spectroscopy applications in which multiple resonances give rise to signals, spectral simplification can be achieved with the spectral editing pulse sequences described herein.

Although the invention has been described in its preferred form, those of skill in the art will recognize that various modifications and changes may be made thereto without departing from the spirit and scope of the claims appended hereto.

We claim:

1. A method for achieving plane rotations of magnetic spins in matter under the influence of a spin aligning magnetic field $\vec{B_0}$ utilizing an adiabatic pulse having $\vec{B_1}$ components transverse to said $\vec{B_0}$ field wherein said pulse introduces a field $\Delta\omega$ in said matter equal to the time dependent difference of the spins and wherein the vector sum of $\vec{B_1}$ and $\Delta\omega/\gamma$ introduce an effective field $\vec{B^e}$ in said matter, where $\gamma$ is the gyromagnetic ratio, said method comprising generating said adiabatic pulse to be symmetrical in amplitude and phase about is center and to include a pair of discontinuous phase shifts $\vec{\phi_1}$, $\phi_2$ in $\vec{B_1}$ of substantially equal and opposite sign symmetrically positioned in said pulse, each phase shift executed concomitantly with an inversion in $\Delta\omega$ to cause a flip in $\vec{B^e}$ in the frequency modulated frame of reference so that said pulse achieves a plane rotation of said spins with a high degree of insensitivity to off-resonance effects.

2. A method for achieving plane rotations of magnetic spins in matter under the influence of a spin aligning magnetic field $\vec{B_0}$ utilizing an adiabatic pulse having with $\vec{B_1}$ field wherein said pulse introduces a field, $\Delta\omega$, in said matter aligned with B$_0$ equal to the time dependent difference between the frequency of the pulse and the Larmor frequency of the spins and wherein the vector sum of $\vec{B_1}$ and $\Delta\omega/\gamma$ introduce an effective field $\vec{B^e}$ in said matter, where $\gamma$ is the gyromagnetic ratio, said method comprising generating said adiabatic pulse to include:

i) a first segment to cause $\vec{B^e}$ to rotate substantially 90°;
ii) a first discontinuous phase shift of $\phi_1$ in $\vec{B_1}$ after said first segment;
iii) an inversion of $\Delta\omega$ occurring concomitantly with said first discontinuous phase shift to cause $\vec{B^e}$ to flip in the frequency modulated (FM) frame of reference;
iv) a second segment following said first phase shift and $\Delta\omega$ inversion to to rotate substantially 180° in the FM frame of reference;
v) a second discontinuous phase shift of $\phi_2$ in B$_1$ after said second segment with $\phi_2$ of substantially equal but opposite sign to $\phi_1$;
vi) a second inversion of $\Delta\omega$ occurring concomitantly with said second discontinuous phase shift to cause $\vec{B^e}$ to flip in the FM frame of reference;
vii) a third segment following said second phase shift and $\Delta\omega$ inversion to cause $\vec{B^e}$ to rotate substantially 90° in the FM frame of reference; and wherein said pulse is generated so that it is symmetric in amplitude and phase about its center whereby a plane rotation of said spins is achieved with insensitivity to off-resonance effects.

3. A method according to claim 1 further wherein said second segment comprises an adiabatic half-passage followed by the same adiabatic half-passage executed with reverse time dependence.

4. A method according to claim 1 wherein said first and third segments comprise the adiabatic half-passage executed with reverse time-dependence and the adiabatic half-passage, respectively.

5. A method according to claim 1 further wherein a plane rotation of Θ degrees is achieved with one of said phase shifts equal to 180°+Θ/2 and the other equal to −180°−Θ/2.

6. A method according to claim 1, 2, 3, 4 or 5 wherein said $\Delta\omega$ is controlled by modulating the frequency of said pulse.

7. A method according to claim 1, 2, 3, 4 or 5 wherein said $\Delta\omega$ is controlled by continuously modulating the phase of said pulse.

8. A method for achieving plane rotations of magnetic spins in matter under the influence of a spin aligning magnetic field utilizing a composite pulse having $\vec{B_1}$ components transverse to said $\vec{B_0}$ field and wherein said pulse introduces a field in said matter equal to the difference between the frequency of the pulse and the Larmor frequency of the spins and wherein the vector sum of $\vec{B}_1$ and $\vec{\Delta\omega}/\gamma$ introduce an effective field $\vec{B}^e$ in said matter, where $\gamma$ is the gyromagnetic ratio, said method comprising generating said pulse to include:
  i) a first segment to cause magnetization to rotate by an effective angle substantially equal to 90° in a rotating frame of reference;
  ii) a discontinuous phase shift of $\phi_1$ in $\vec{B}_1$ after said first segment;
  iii) a second segment following said first phase shift to cause magnetization to rotate by an effective angle substantially equal to 180° in the rotating frame of reference;
  iv) an additional discontinuous phase shift of $\phi_2$ of said second segment of substantially equal but opposite sign to $\phi_1$;
  v) a third segment following said second phase shift to cause magnetization to rotate by an effective angle substantially equal to 90° in the rotating frame of reference and so that said pulse is generated so that it is symmetric in amplitude and phase about its center whereby a plane rotation of said spins is achieved with a high degree of insensitivity to off-resonance effects.

9. A method according to claim 8 further wherein a plane rotation by an angle equal to $\Theta$ is achieved with one of said phase shift equal to $180° + \Theta/2$ and the other equal to $-180° - \Theta/2$.

10. A method for achieving plane rotations of magnetic spins in matter under the influence of a spin aligning magnetic field $\vec{B}_0$ utilizing a composite pulse having $\vec{B}_1$ components transverse to said $\vec{B}_0$ field and wherein said pulse introduces a field in said matter equal to the difference between the frequency of the pulse and the Larmor frequency of the spins and wherein the vector sum of $\vec{B}_1$ and $\vec{\Delta\omega}/\gamma$ introduce an effective field $\vec{B}^e$ in said matter, where $\gamma$ is the gyromagnetic ratio, said method comprising generating said composite pulse to be symmetrical about its center and in the following form:

$$\Theta_0 \Theta^{-1}{}_{(\beta/2)} \Theta_{(180°+\beta/2)} \Theta^{-1}{}_{180°}$$

where $\beta$ is the desired rotation angle to be achieved by the pulse in a rotating frame of reference, $\Theta_0$ is one or more square pulses, (i.e. having constant phase and amplitude) which together produce a substantially 90° rotation of the magnetization vectors, and $\Theta^{-1}{}_{(\beta/2)}$ is the inverse of $\Theta_0$ with $\beta/2$ added to phases of all the pulses, and wherein the inverse of $\Theta_0$, ($\Theta_0{}^{-1}$) is generated by adding 180° to the phases of the square pulse(s) composing $\Theta_0$ and executing these pulses in reverse order, and further wherein $\Theta^{-1}{}_{180°}$ is the inverse of $\Theta_{(180°+\beta/2)}$ with $\beta/2$ subtracted from the phases of the square pulse(s).

11. A method for achieving spectral editing by selectively generating signals from selected nuclei engaged in spin-spin coupling in matter under the influence of a spin aligning magnetic field utilizing an adiabatic pulse having $\vec{B}_1$ components transverse to said wherein said pulse introduces a field $\vec{\Delta\omega}$ in said matter equal to the time dependent difference between the frequency of the pulse and the Larmor frequency of the spins and wherein the vector sum of $\vec{B}_1$ and $\vec{\Delta\omega}/\gamma$ introduce an effective field $\vec{B}^e$ in said matter, where $\gamma$ is the gyromagnetic ratio, said method comprising generating said adiabatic pulse to include:
  i) a first, second and third segment to cause $\vec{B}^e$ to rotate substantially 90°, substantially 180°, and substantially 90°, respectively, in the frequency modulated (FM) frame of reference;
  ii) a delay $\tau$ between said first and second segments and said second and third segments, said delay $\tau$ substantially equal to $1/(8J)$ where J is the spin-spin coupling constant in Hz units of the selected spins, so that the selected spins undergo effective phase shifts of $\phi_1$ and $\phi_2$, respectively, where $\phi_1 = 2\pi(\nu\pi + (\frac{1}{4}))$ and $\phi_2 = 2\pi(\nu\tau \pm (\frac{1}{4}))$, and where $\nu$ is the spin precessional frequency in the FM frame of reference in the absence of spin-spin coupling;
  iii) a 180° discontinuous phase shift implemented concomitantly with an inversion to $\vec{\Delta\omega}$ to cause $\vec{B}^e$ in the FM to flip at the end of each said delay $\tau$;
whereby J-filtering can be achieved.

12. A method according to claim 11 further including a second adiabatic inversion pulse, $180°_a$, applied concomitantly with said second segment at a frequency to invert the spin state of a second spin which is engaged in heteronuclear spin-spin coupling with said selected spins; whereby heteronuclear spectral editing can be achieved.

13. A method for achieving spectral editing by selectively generating signals from selected nuclei engaged in spin-spin coupling in matter under the influence of a spin aligning magnetic field $\vec{B}_0$ utilizing an adiabatic pulse having $\vec{B}_1$ components transverse to said $\vec{B}_0$ field wherein said pulse introduces a field $\vec{\Delta\omega}$ in said matter equal to the time dependent difference between the frequency of the pulse and the Larmor frequency of the spins and wherein the vector sum of $\vec{B}_1$ and $\vec{\Delta\omega}/\gamma$ introduce an effective field $\vec{B}^e$ said matter, where $\gamma$ is the gyromagnetic ratio, said method comprising generating said adiabatic pulse to include:
  i) a first, second and third segment to cause $\vec{B}^e$ to rotate substantially 90° substantially 180°, and substantially 90°, respectively, in the frequency modulated (FM) frame of reference;
  ii) a delay $\tau$ between said first and second segments and said second and third segments, said delay $\tau$ substantially equal to $1/(2J)$ where J is the spin-spin coupling constant in Hz units;
  iii) a 180° discontinuous phase shift implemented concomitantly with an inversion of $\Delta\omega$ to cause $\vec{B}^e$ to flip in the FM frame of reference at the end of each said delay $\tau$;
  iv) a second adiabatic inversion pulse, $180°_{as}$, applied during the middle of the said first (or second) $\tau$ delay at a frequency to invert the spin state of a second homo or heteronucleus which is engaged in spin-spin coupling with the first spin experiencing the processes described in i-iii above so that the selected first spins undergo the phase shifts, $\phi_1$ and $\phi_2$, respectively, $\phi_1 = 2\pi(\nu\pi \pm (\frac{1}{4}))$ and $\phi_2 = 2\pi\nu\tau$ (or $\phi_1 = 2\pi\nu\tau$ and $\phi_2 = 2\pi(\nu\tau \pm (\frac{1}{4}))$), where $\nu$ is the spin precessional frequency of reference in the absence of spin-spin coupling;
whereby spectral editing can be achieved.

* * * * *

UNITED STATES PATENT AND TRADEMARK OFFICE
CERTIFICATE OF CORRECTION

PATENT NO. : 5,019,784            Page 1 of 5

DATED : May 28, 1991

INVENTOR(S) : Garwood, et al.

It is certified that error appears in the above-identified patent and that said Letters Patent is hereby corrected as shown below:

On title page item [54], line 4,
    delete "B1" and insert thereto --$B_1$--.

Item [57] ABSTRACT, line 6, delete "$B^e$" and insert thereto --$\vec{B}^e$--.

In Column 1, Line 5, title of patent, delete "B1" and insert thereto --$B_1$--.

In Column 2, Line 34, delete "66:470.482;" and insert therein --66:470-482;--.

In Column 2, Line 37, delete "67:376.381;" and insert therein --67:376-381;--.

In Column 2, Line 44, delete "Garwood." and insert therein --Garwood,--.

In Column 3, Line 17, delete "enven" and insert therein --even--.

In Column 4, Line 66, delete "Kempsll" and insert therein --Kempsell--.

In Column 5, Line 1, delete "39:453" and insert therein --38:453--.

In Column 5, Line 10, delete "$\geq$" and insert therein --$\gtrsim$--.

UNITED STATES PATENT AND TRADEMARK OFFICE
CERTIFICATE OF CORRECTION

PATENT NO. : 5,019,784
DATED : May 28, 1991
INVENTOR(S) : Garwood, et al.

It is certified that error appears in the above-identified patent and that said Letters Patent is hereby corrected as shown below:

In Column 5, line 24, after "olution" insert therein --.--.

In Column 5, Line 41, delete "rate" and insert therein --rat--.

In Column 6, Line 23, delete "0" and insert therein --$\theta$--.

In Column 7, Line 5, delete "$\vec{B}_1$" and insert therein --$B_1$--.

In Column 7, Line 6, delete "$\Delta w$ to cause $B^e$" and insert therein --$\vec{\Delta w}$ to cause $\vec{B}^e$--.

In Column 7, Line 8, delete "$B^e$" and insert therein --$\vec{B}^e$--.

In Column 7, Line 37, delete "$\gamma B_1°$" and insert therein --$\gamma B°_1$--.

In Column 7, Line 38, delete "$B_1°$" and insert therein --$B°_1$--.

In Column 7, Line 38, delete "$B_1°$" and insert therein --$B°_1$--.

In Column 8, Lines 39 and 40, delete "chamgers" and insert therein --chambers--.

UNITED STATES PATENT AND TRADEMARK OFFICE
CERTIFICATE OF CORRECTION

PATENT NO. : 5,019,784

DATED : May 28, 1991

INVENTOR(S) : Garwood, et al.

It is certified that error appears in the above-identified patent and that said Letters Patent is hereby corrected as shown below:

In Column 8, Line 59, after the word "applied" delete "." and insert therein --,--.

In Column 10, Line 2, after "second" insert therein --$\gamma$--.

In Column 10, Line 12, delete "$(\upsilon\pm(J/2))$" and insert therein --$(\upsilon\mp(J/2))$--.

In Column 10, Line 42, delete "80°" and insert therein --180°--.

Col. 10, line 45, after "pulse," insert therein --$180°_a$,--

In Column 11, Line 39, after "will" insert therein --be--.

In Column 11, Line 49, after "incremental" insert therein --$\gamma$--.

In Column 11, Line 65, delete "$\Delta w$" and insert therein --$\vec{\Delta w}$--.

In Column 11, Line 67, delete "$\Delta w/\gamma$" and insert therein --$\vec{\Delta w}/\gamma$--.

UNITED STATES PATENT AND TRADEMARK OFFICE
CERTIFICATE OF CORRECTION

PATENT NO. : 5,019,784

DATED : May 28, 1991

INVENTOR(S) : Garwood, et al.

It is certified that error appears in the above-identified patent and that said Letters Patent is hereby corrected as shown below:

In Column 12, Line 14 delete "with" and insert therein --a--.

In Column 12, Line 15 delete "$B_o$" and insert therein --$\vec{B}_o$--.

In Column 12, Line 31, after the first occurrence of "to" insert therein --cause $B_e$--.

In Column 12, Line 33, delete "$B_1$" and insert therein --$\vec{B}_1$--.

In Column 12, Line 66, after "field" insert therein --$\vec{B}_o$--.

In Column 12, Line 68, after "field" insert therein --$\vec{\Delta w}$--.

In Column 13, Line 34, after "field" insert therein --$\vec{\Delta w}$--.

In Column 13, Line 60, after "field" insert therein --$\vec{B}_o$--.

Col. 13, line 61, after "said" insert therein --$B_o$ field--

In Column 14, Line 13, delete "$(\nu\pi + (1/8))$" and insert therein --$\nu\tau \pm (1/8))$--.

UNITED STATES PATENT AND TRADEMARK OFFICE
CERTIFICATE OF CORRECTION

PATENT NO. : 5,019,784

DATED : May 28, 1991

INVENTOR(S) : Garwood, et al.

It is certified that error appears in the above-identified patent and that said Letters Patent is hereby corrected as shown below:

In Column 14, Line 13, delete "$(\nu\gamma \pm (1/8))$," and insert therein $--(\nu\gamma \mp (1/8))--$.

In Column 14, Line 38, after "$\vec{B}_e$" insert therein --in--.

Column 14, line 42, after "90°" insert therein --,--

In Column 14, Line 51, delete "$\Delta w$" and insert therein $--\vec{\Delta w}--$.

In Column 14, Line 61, delete "$(\nu\pi \pm (1/4))$" and insert therein $--(\nu\tau \pm (1/4))--$.

In Column 14, Line 63, after "frequency" insert therein --in the FM frame--.

Signed and Sealed this

Sixteenth Day of November, 1993

Attest:

BRUCE LEHMAN

Attesting Officer

Commissioner of Patents and Trademarks